(12) United States Patent
Zheng et al.

(10) Patent No.: US 11,587,472 B2
(45) Date of Patent: Feb. 21, 2023

(54) FOLDABLE DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventors: Min Zheng, Wuhan (CN); Mugyeom Kim, Wuhan (CN); Yong Zhao, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 262 days.

(21) Appl. No.: 16/640,362

(22) PCT Filed: Dec. 20, 2019

(86) PCT No.: PCT/CN2019/126889
§ 371 (c)(1),
(2) Date: Feb. 20, 2020

(87) PCT Pub. No.: WO2021/036118
PCT Pub. Date: Mar. 4, 2021

(65) Prior Publication Data
US 2021/0407330 A1    Dec. 30, 2021

(30) Foreign Application Priority Data

Aug. 29, 2019    (CN) .......................... 201910809497.4

(51) Int. Cl.
*G09F 9/30* (2006.01)
*H01L 27/32* (2006.01)
*H01L 51/52* (2006.01)

(52) U.S. Cl.
CPC .......... *G09F 9/301* (2013.01); *H01L 27/3246* (2013.01); *H01L 51/524* (2013.01); *H01L 51/5253* (2013.01); *H01L 2251/5338* (2013.01)

(58) Field of Classification Search
CPC ... G09F 9/301; H01L 27/3246; H01L 51/524; H01L 51/5253; H01L 2251/5338;
(Continued)

(56) References Cited

U.S. PATENT DOCUMENTS

2005/0225756 A1\* 10/2005 Khamizov ......... G01N 21/6452
356/246
2009/0135622 A1\* 5/2009 Johnson .................. G09F 13/22
427/64
(Continued)

FOREIGN PATENT DOCUMENTS

CN        105609533 A      5/2016
CN        106383610 A      2/2017
(Continued)

*Primary Examiner* — S M Sohel Imtiaz
(74) *Attorney, Agent, or Firm* — PV IP PC; Wei Te Chung; Ude Lu

(57) ABSTRACT

A foldable display panel, including an active area and a non-active area disposed around the active area, and a deformation layer disposed in the non-active area of the display panel. A material of the deformation layer includes a force-strained material configured to detect a degree of deformation and a cracking defect of the display panel according to a luminous color and brightness of the force-strained material.

9 Claims, 3 Drawing Sheets

(58) Field of Classification Search
CPC ............ H01L 27/3241; H01L 51/0097; H01L 23/562; H01L 51/0031; H01L 51/56
See application file for complete search history.

(56) References Cited

U.S. PATENT DOCUMENTS

| | | |
|---|---|---|
| 2014/0183473 A1* | 7/2014 | Lee ................. G06F 1/1641 257/40 |
| 2016/0258114 A1* | 9/2016 | Firth ................. B42D 25/36 |
| 2017/0194592 A1* | 7/2017 | Jiang ................ H01L 51/0097 |
| 2018/0047938 A1* | 2/2018 | Kishimoto .......... H01L 51/0097 |
| 2018/0224688 A1* | 8/2018 | Chen ................ G02F 1/13454 |
| 2019/0157361 A1 | 5/2019 | Lee et al. |
| 2019/0157607 A1* | 5/2019 | Kim ................. H01L 51/0097 |
| 2019/0324567 A1* | 10/2019 | Hong ................ G06F 3/0443 |
| 2019/0393278 A1* | 12/2019 | Wu .................. G06F 3/041 |

FOREIGN PATENT DOCUMENTS

| | | |
|---|---|---|
| CN | 107437400 | 12/2017 |
| CN | 106154800 | 6/2018 |
| CN | 208126840 U | 11/2018 |
| CN | 208422960 | 1/2019 |
| CN | 109830502 A | 5/2019 |

* cited by examiner

FOLDABLE DISPLAY PANEL

The present application claims the priority of China Patent Application No. 201910809497.4 submitted to the National Intellectual Property Administration on Aug. 29, 2019, titled "FOLDABLE DISPLAY PANEL", which is incorporated by reference in the present application in its entirety.

TECHNICAL FIELD

The present invention relates to the field of display panel technology, and more particularly, to a foldable display panel.

BACKGROUND

Along with application of flexible OLED screens, foldable display panels have emerged. However, during manufacturing processes, since stress is generated when the foldable display panel is bent, it may cause problems of separation or fracture between layers thereof. For foldable display panels in the prior art, cracks or defects therein cannot be directly detected. If defective display panels are mass-produced, yield of the display panels will be reduced.

Technical Problem

An embodiment of the present invention provides a foldable display panel, which is able to detect a deformation degree and a cracking defect of the display panel according to a luminous color and brightness of a deformation layer, thus improving the mass-production yield.

Technical Solution

An embodiment of the present invention provides a foldable display panel, the display panel comprises an active area and a non-active area disposed around the active area, a deformation layer disposed in the non-active area of the display panel;

wherein a material of the deformation layer comprises a force-strained material configured to detect a degree of deformation and a cracking defect of the display panel according to a luminous color and brightness of the force-strained material; and wherein the force-strained material comprises any one of a photoinitiator material, a fluorescent material, or a phosphorescent material.

In an embodiment, the deformation layer comprises a detection layer, and the force-strained material is disposed in the detection layer.

Optionally, the detection layer is a transparent organic layer.

Optionally, the deformation layer comprises a planarization layer, a pixel definition layer, a spacer layer, and a protective layer that are sequentially disposed; and wherein the detection layer comprises at least one of the planarization layer, the pixel definition layer, the spacer layer, or the protective layer.

Further, the display panel further comprises a metal layer, and the deformation layer is disposed on the metal layer to reflect light emitted by the force-strained material via the metal layer.

Further, the non-active area comprises a bending area, and the deformation layer is located in the bending area.

In another embodiment, the deformation layer comprises an encapsulation layer and a sealing layer disposed at an edge of the encapsulation layer; and wherein the force-strained material is disposed in the sealing layer.

Further, the deformation layer further comprises a dam covered by the encapsulation layer; and wherein the force-strained material is further disposed in the dam.

Further, the non-active area comprises a border area and a corner area; and wherein the deformation layer is located in the border area or the corner area.

Further, the photoinitiator material comprises benzophenone.

An embodiment of the present invention further provides a foldable display panel, the display panel comprises an active area and a non-active area disposed around the active area, a deformation layer disposed in the non-active area of the display panel; wherein a material of the deformation layer comprises a force-strained material configured to detect a degree of deformation and a cracking defect of the display panel according to a luminous color and brightness of the force-strained material.

In an embodiment, the deformation layer comprises a detection layer, and the force-strained material is disposed in the detection layer.

Optionally, the detection layer is a transparent organic layer.

Optionally, the deformation layer comprises a planarization layer, a pixel definition layer, a spacer layer, and a protective layer that are sequentially disposed; and wherein the detection layer comprises at least one of the planarization layer, the pixel definition layer, the spacer layer, or the protective layer.

Further, the display panel further comprises a metal layer, and the deformation layer is disposed on the metal layer to reflect light emitted by the force-strained material via the metal layer.

Further, the non-active area comprises a bending area, and the deformation layer is located in the bending area.

In another embodiment, the deformation layer comprises an encapsulation layer and a sealing layer disposed at an edge of the encapsulation layer; and wherein the force-strained material is disposed in the sealing layer.

Further, the deformation layer further comprises a dam covered by the encapsulation layer; and wherein the force-strained material is further disposed in the dam.

Further, the non-active area comprises a border area and a corner area; and wherein the deformation layer is located in the border area or the corner area.

Beneficial Effect

The beneficial effects of the present invention are as follows: A non-active area of a display panel is provided with a deformation layer, and a material of the deformation layer includes a force-strained material. By irradiating the deformation layer with ultraviolet light, since a luminous color and brightness of the force-strained material in the deformation layer are different under different deformation degrees, stress-visualization is realized according to the luminous color and brightness of the deformation layer, thus detecting defects in the display panel and preventing the mass-production of defective display panels, and thereby improving the mass-production yield of the display panel.

DESCRIPTION OF DRAWINGS

In order to clearly illustrate embodiments or technical solution in the prior art, a brief description of drawings used in the embodiments or the description of the prior art would be given as below. Obviously, the drawings in the following description are merely some embodiments of the invention. For persons skilled in this art, other drawings can be obtained from these drawings under the premise of no creative efforts made.

DETAILED DESCRIPTION OF PREFERRED EMBODIMENTS

Figure 1:
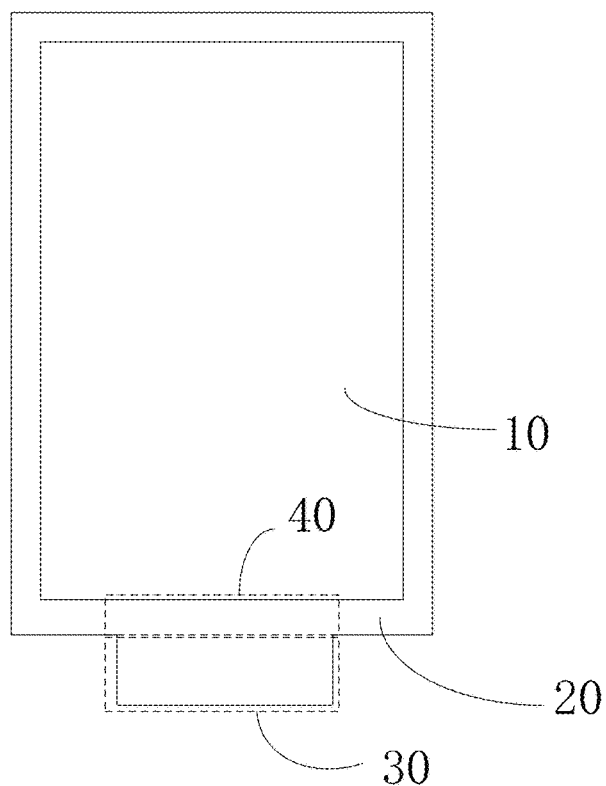
FIG. 1 is a schematic structural diagram showing a foldable display panel according to an embodiment of the present invention.

The preferred embodiments of the present invention are described below with referring to the appending drawings of the specification to illustrate that the present invention is capable of being implemented. The technical content of the present invention is completely described to persons skilled in the art according to these embodiments, making the technical content of the present invention clearer and easier to understand. However, the present invention may be embodied by many different forms of embodiments, and the protection scope of the present invention is not limited to the embodiments mentioned in the content.

The terms used in the description of the present invention are only used to describe specific embodiments and are not intended to show the concepts of the present invention. Unless a different meaning is clearly indicated in the context, expressions used in the singular include expressions in the plural. In the specification of the present invention, it should be understood that terms such as "including", "having", and "containing" are intended to indicate the possibility of features, numbers, steps, actions, and combinations thereof disclosed in the specification of the present invention, and are not intended excludes the possibility that one or more other features, numbers, steps, actions, and combinations thereof which may be present or may be added. The same reference numbers in the drawings refer to the same parts.

Refer to FIG. 1, which is a schematic structural diagram showing a foldable display panel according to an embodiment of the present invention.

As shown in FIG. 1, the foldable display panel provided by the present embodiment includes an active area 10 and a non-active area 20 disposed around the active area 10. Wherein, the active area 10 may be a display area of the display panel, and the non-active area 20 may be a non-display area of the display panel.

The non-active area of the display panel is provided with a deformation layer. The deformation layer refers to a film layer that is deformed by stress during a bending process of the display panel. A material of the deformation layer includes a force-strained material. The force-strained material emits light when it is irradiated by ultraviolet (UV) light, and a luminous color and brightness of the force-strained material are different with different stresses. Therefore, a degree of deformation and a cracking defect of the display panel are detected according to the luminous color and brightness of the force-strained material, thereby detecting whether there are defects in the display panel. For example, detecting if cracks occur in the film layers of the display panel and if a stress on the film layers is uniform, etc., so as to prevent the mass-production of defective display panels, thereby improving the mass-production yield of the display panel.

Specifically, the force-strained material includes any one of a photoinitiator material, a fluorescent material, or a phosphorescent material, and the photoinitiator material includes benzophenone. If the force-strained material is the photoinitiator material, ultraviolet light irradiation of the photoinitiator material will excite free radicals in the photoinitiator material, and a cross-linked structure of polymer thereof can be changed, thereby causing the photoinitiator material to emit light. The bending of the display panel causes the photoinitiator material to deform to different degrees, which will cause a wavelength of emitted light to "blue shift" and "red shift", thereby changing light emitting colors. If the force-strained material is the fluorescent material or the phosphorescent material, a crack will be generated when the display panel is bent, and the fluorescent material or phosphorescent material in the crack is exposed. The light emitted by the fluorescent material or the phosphorescent material is released by UV light irradiation. The luminous color and brightness of the fluorescent material or the phosphorescent material are different with different deformation degrees of the display panel.

In an embodiment, the deformation layer includes a detection layer, and the force-strained material is disposed in the detection layer. Specifically, the detection layer is a transparent organic layer, that is, the transparent organic layer is doped with the force-strained material. If the detection layer is included in the deformation layer, the deformation layer may be disposed in a bending area of the display panel, that is, the bending area is provided with the transparent organic layer doped with the force-strained material. As shown in FIG. 1, the non-active area 20 includes a bending area 30, which is close to a lower border of the display panel, and the bending area 30 can be folded to a back of the display panel. The bending area 30 is provided with the transparent organic layer. During a bending process of the display panel, the bending area 30 is irradiated with UV light and a degree of deformation and a cracking defect of the display panel are detected according to a luminous color and brightness of the force-strained material in the transparent organic layer.

Figure 2:
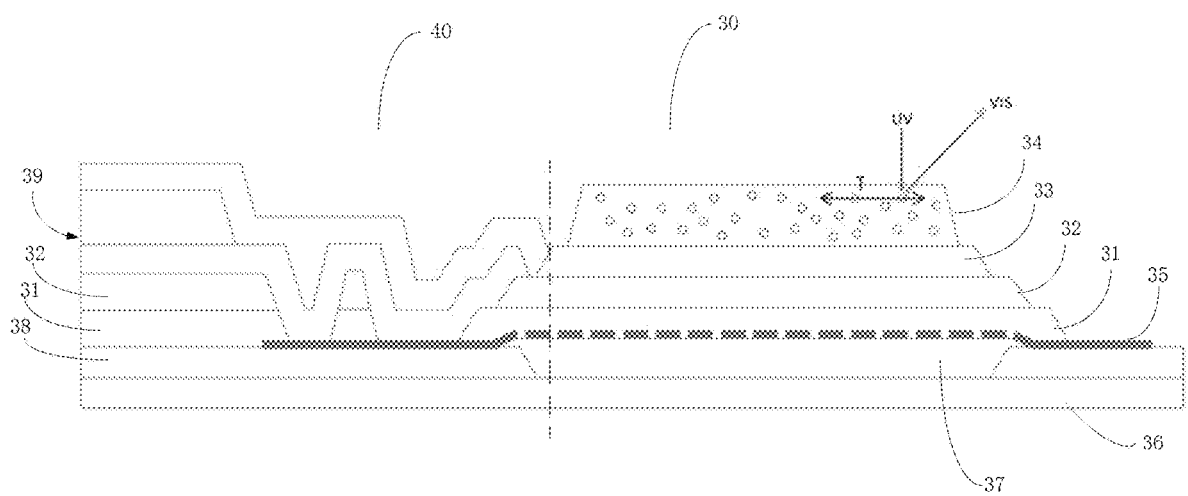
FIG. 2 is a cross-sectional view of an encapsulation edge area and a bending area of the foldable display panel according to the embodiment of the present invention.

Specifically, the deformation layer includes a planarization layer, a pixel definition layer, a spacer layer, and a protective layer that are sequentially disposed, and the deformation layer may be located in the bending area. That is, as shown in FIG. 2, the bending area 30 is sequentially provided with a planarization layer 31, a pixel definition layer 32, a spacer layer 33, and a protective layer 34. The detection layer includes at least one of the planarization layer 31, the pixel definition layer 32, the spacer layer 33, or the protective layer 34. That is, a material of at least one of the planarization layer 31, the pixel definition layer 32, the spacer layer 33, or the protective layer 34 is doped with the force-strained material.

For example, a material of the protective layer 34 in FIG. 2 is doped with the force-strained material. During a bending process of the display panel, the protective layer 34 is deformed by a transverse-tensile force T. By irradiating the protective layer 34 with UV light, a luminous color and brightness of the force-strained material which is doped into the protective layer 34 and emits VIS light are changed, so that a deformation degree and a cracking defect of the display panel are detected according to a change of the luminous color and brightness.

Further, the display panel further includes a metal layer, and the deformation layer is disposed on the metal layer. That is, as shown in FIG. 2, the bending area 30 is further provided with a metal layer 35, and the deformation layer is disposed on the metal layer 35 for reflecting light emitted by the force-strained material via the metal layer 35.

It should be noted that the metal layer 35 may include a source electrode and a drain electrode. The metal layer 35 is disposed on a side of the planarization layer 31 away from the pixel definition layer 32. In a case that at least one of the planarization layer 31, the pixel definition layer 32, the spacer layer 33, or the protective layer 34 is doped with the force-strained material, the light emitted by the force-strained material reaches to the metal layer 35 and is reflected by the metal layer 35, so that more light is sensed to detect a luminous color and brightness of the force-strained material.

Further, the display panel further includes a substrate 36 and an organic filling layer 37. The organic filling layer 37 is disposed on a side of the metal layer 35 away from the planarization layer 31, and the substrate 36 is disposed on a side of the organic filling layer 37 away from the metal layer 35.

Specifically, in a manufacturing process, the substrate 36, the organic filling layer 37, and the metal layer 35 are sequentially prepared, and then a polyimide (PI) material of at least one of the planarization layer 31, the pixel definition layer 32, the spacer layer 33, or the protective layer 34 is doped with the force-strained material, and they are coated on the metal layer 35 and are cured by UV light to form corresponding film layers.

In addition, as shown in FIG. 1 and FIG. 2, the non-active area 20 further includes an encapsulation edge area 40, which is located between the active area 10 and the bending area 30. The encapsulation edge area 40 includes the substrate 36, a buffer layer 38, the metal layer 35, the planarization layer 31, the pixel definition layer 32, and an encapsulation layer 39 that are sequentially disposed, and no further elaboration on details will be made.

In another embodiment, the deformation layer includes an encapsulation layer and a sealing layer. The sealing layer is disposed at an edge of the encapsulation layer, and the force-strained material is disposed in the sealing layer. Further, the deformation layer further includes a dam which is covered by the encapsulation layer, and the force-strained material is further disposed in the dam. In a case that the deformation layer includes the encapsulation layer and the sealing layer, the deformation layer may be disposed in a border area or a corner area of the display panel.

Figure 3:
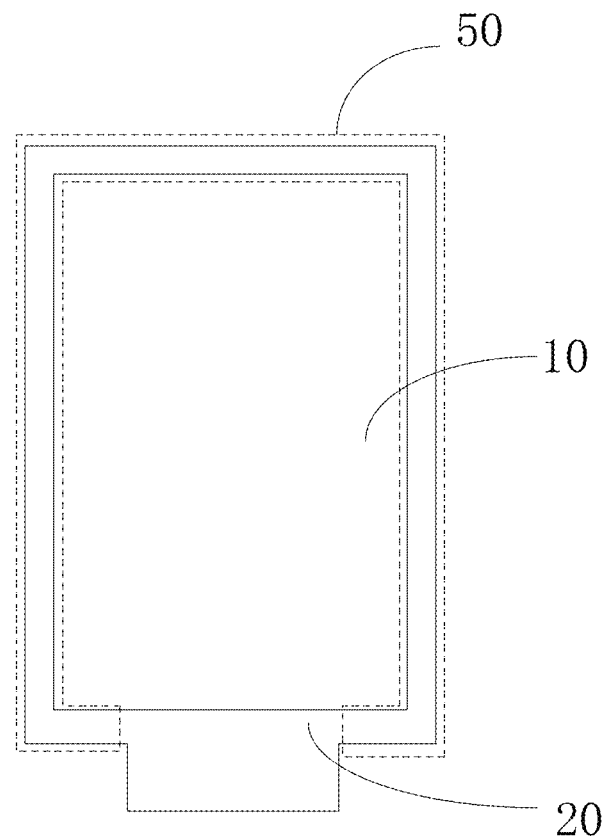
FIG. 3 is a schematic structural diagram showing a foldable display panel according to an embodiment of the present invention.
Figure 4:
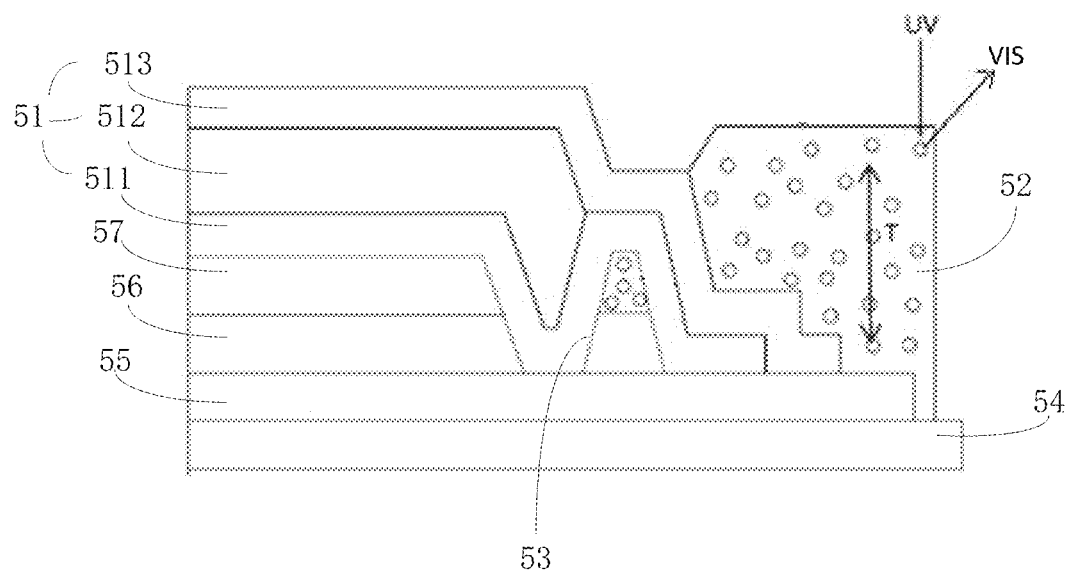
FIG. 4 is a cross-sectional view of a border area of the foldable display panel according to the embodiment of the present invention.

If the deformation layer is located in the border area, as shown in FIG. 3, the non-active area 20 includes a border area 50, and the border area 50 is an area of the non-active area 20 excluding the bending area 30 and the encapsulation edge area 40. As shown in FIG. 4, the border area 50 is provided with a first encapsulation layer 51 and a first sealing layer 52, and the first sealing layer 52 is disposed at an edge of the first encapsulation layer 51. The first sealing layer is used for sealing the edge of the first encapsulation layer 51 to prevent water and oxygen from entering the active area 10 through the edge of the first encapsulation layer 51. By detecting defects of the display panel through stress-visualization, adhesion between the layers can be further enhanced.

The first sealing layer 52 is doped with the force-strained material, and the deformation layer includes the first sealing layer 52. The first encapsulation layer 51 and the first sealing layer 52 may be separated from each other, so that the first sealing layer 52 is deformed by a longitudinal-tensile force T. The border area 50 is irradiated with UV light, and a deformation degree and a cracking defect of the first sealing layer 52 are detected according to a luminous color and brightness of the force-strained material which emits VIS light in the transparent organic layer.

Further, as shown in FIG. 4, the border area 50 is further provided with a first dam 53 which is covered by the first encapsulation layer 51. The first dam 53 is doped with the force-strained material, and the deformation layer further includes the first dam 53.

It should be noted that, the border area 50 is further sequentially provided with a substrate 54, a buffer layer 55, a planarization layer 56, and a pixel definition layer 57. Specifically, a material of the pixel definition layer 57 in the dam 53 is doped with the force-strained material. The first encapsulation layer 51 specifically includes a first inorganic layer 511, an organic layer 512, and a second inorganic layer 513. The first inorganic layer 511 is disposed on the pixel definition layer 57, the buffer layer 55, and the first dam 53. The organic layer 512 is disposed on the first inorganic layer 511. The second inorganic layer 513 is disposed on the organic layer 512, the first inorganic layer 511, and the buffer layer 55. The first sealing layer 52 is disposed on the second inorganic layer 513 and the buffer layer 55.

Figure 5:
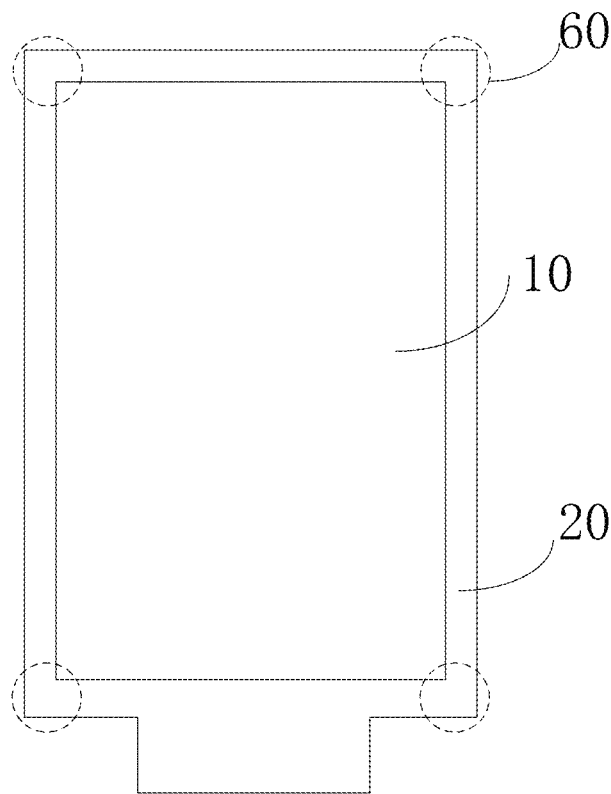
FIG. 5 is a schematic structural diagram showing a foldable display panel according to an embodiment of the present invention.
Figure 6:
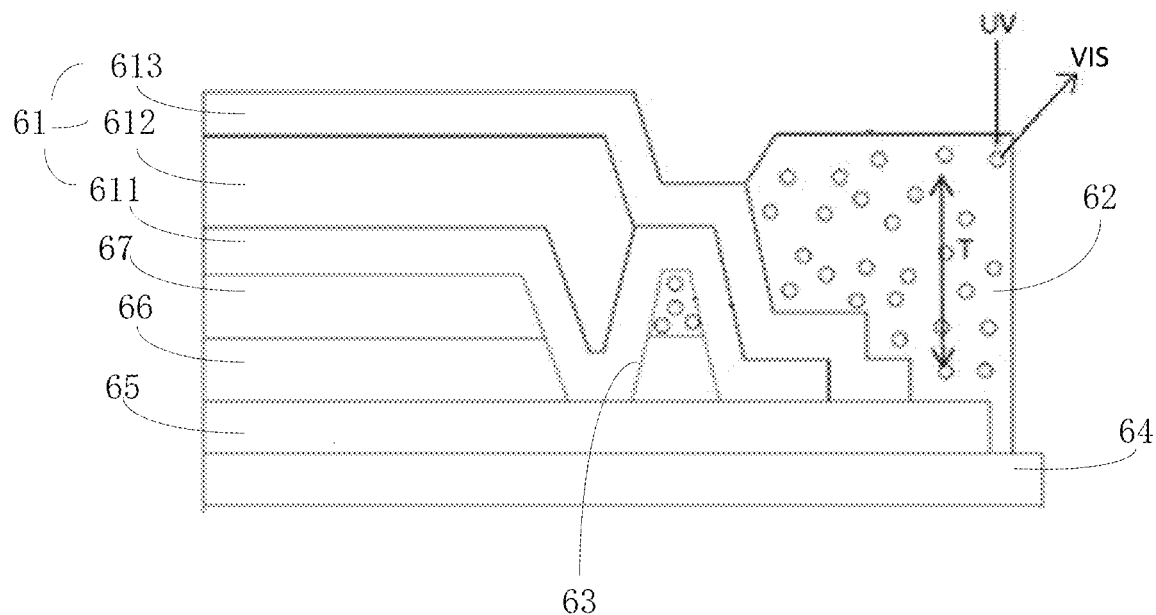
FIG. 6 is a cross-sectional view of a corner area of the foldable display panel according to the embodiment of the present invention.

If the deformation layer is located in the corner area, as shown in FIG. 5, the non-active area 20 further includes a corner area 60, and the corner area 60 refers to four corners of the display panel. As shown in FIG. 6, the corner area 60 is provided with a second encapsulation layer 61 and a second sealing layer 62. The second sealing layer 62 is disposed at an edge of the second encapsulation layer 61. The second sealing layer 62 is used for sealing the edge of the second encapsulation layer 61 to prevent water and oxygen from entering the active area 10 through the edge of the second encapsulation layer 61. By detecting defects of the display panel through stress-visualization, adhesion between the layers can be further enhanced.

The second sealing layer 62 is doped with the force-strained material, and the deformation layer includes the second sealing layer 62. The second encapsulation layer 61 and the second sealing layer 62 in the corner area 60 are easily separated from each other, so that the second sealing layer 62 is deformed by a longitudinal-tensile force T. The corner area 60 is irradiated with UV light, and a deformation degree and a cracking defect of the second sealing layer 62 are detected according to a luminous color and brightness of the force-strained material which emits VIS light in the transparent organic layer.

Further, the corner area 60 is further provided with a second dam 63 which is covered by the second encapsulation layer 61. The second dam 63 is doped with the force-strained material, and the deformation layer further includes the second dam 63.

It should be noted that, the corner area 60 is further sequentially provided with a substrate 64, a buffer layer 65, a planarization layer 66, and a pixel definition layer 67. The second dam 63 includes a part of the planarization layer 66 and the pixel definition layer 67. Specifically, a material of the pixel definition layer 67 in the dam 63 is doped with the force-strained material. The second encapsulation layer 61 specifically includes a first inorganic layer 611, an organic layer 612, and a second inorganic layer 613. The first inorganic layer 611 is disposed on the pixel definition layer 67, the buffer layer 65, and the second dam 63. The organic layer 612 is disposed on the first inorganic layer 611. The second inorganic layer 613 is disposed on the organic layer 612, the first inorganic layer 611, and the buffer layer 65. The second sealing layer 62 is disposed on the second inorganic layer 613 and the buffer layer 65.

It can be known from the above, the deformation layer may be disposed in the non-active area of the display panel according to the foldable display panel provided by the present embodiment, and the material of the deformation layer includes the force-strained material. By irradiating the deformation layer with UV light, since a luminous color and brightness of the force-strained material in the deformation layer are different under different deformation degrees, stress-visualization is realized according to the luminous color and brightness of the deformation layer, thus detecting defects in the display panel and preventing the mass-production of defective display panels, and thereby improving the mass-production yield of the display panel.

In summary, although the present invention has been disclosed above in the preferred embodiments, the above preferred embodiments are not intended to limit the present invention. For persons skilled in this art, various modifications and alterations can be made without departing from the spirit and scope of the present invention. The protective scope of the present invention is subject to the scope as defined in the claims.

What is claimed is:

1. A foldable display panel, comprising:
   an active area; and
   a non-active area disposed around the active area; and
   a deformation layer disposed in the non-active area of the display panel,
   wherein a material of the deformation layer comprises a force-strained material configured to detect a degree of deformation and a cracking defect of the display panel according to a luminous color and brightness of the force-strained material, and
   wherein the force-strained material comprises any one of a photoinitiator material, a fluorescent material, or a phosphorescent material,
   wherein the deformation layer comprises a detection layer, and the force-strained material is disposed in the detection layer,
   wherein the deformation layer comprises a planarization layer, a pixel definition layer, a spacer layer and a protective layer that are sequentially disposed; and
   wherein the detection layer comprises at least one of the planarization layer, the pixel definition layer, the spacer layer or the protection layer.

2. The foldable display panel as claimed in claim 1, wherein the detection layer is a transparent organic layer.

3. The foldable display panel as claimed in claim 1, wherein the display panel further comprises a metal layer, and the deformation layer is disposed on the metal layer to reflect light emitted by the force-strained material via the metal layer.

4. The foldable display panel as claimed in claim 1, wherein the non-active area comprises a bending area, and the deformation layer is located in the bending area.

5. The foldable display panel as claimed in claim 1, wherein the photoinitiator material comprises benzophenone.

6. A foldable display panel, comprising:
   an active area; and
   a non-active area disposed around the active area; and
   a deformation layer disposed in the non-active area of the display panel,
   wherein a material of the deformation layer comprises a force-strained material configured to detect a degree of deformation and a cracking defect of the display panel according to a luminous color and brightness of the force-strained material,
   wherein the deformation layer comprises a detection layer, and the force-strained material is disposed in the detection layer,
   wherein the deformation layer comprises a planarization layer, a pixel definition layer, a spacer layer and a protective layer that are sequentially disposed; and
   wherein the detection layer comprises at least one of the planarization layer, the pixel definition layer, the spacer layer or the protection layer.

7. The foldable display panel as claimed in claim 6, wherein the detection layer is a transparent organic layer.

8. The foldable display panel as claimed in claim 6, wherein the display panel further comprises a metal layer, and the deformation layer is disposed on the metal layer to reflect light emitted by the force-strained material via the metal layer.

9. The foldable display panel as claimed in claim 6, wherein the non-active area comprises a bending area, and the deformation layer is located in the bending area.

* * * * *